(12) United States Patent
Pradeep et al.

(10) Patent No.: US 6,346,468 B1
(45) Date of Patent: Feb. 12, 2002

(54) METHOD FOR FORMING AN L-SHAPED SPACER USING A DISPOSABLE POLYSILICON SPACER

(75) Inventors: Yelehanka Ramachandramurthy Pradeep; Subhash Gupta, both of Singapore (SG); Vijai Komar Chhagan, Belgrave (GB)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/502,037

(22) Filed: Feb. 11, 2000

(51) Int. Cl.⁷ .......................................... H01L 21/3205
(52) U.S. Cl. ...................................... 438/595; 438/303
(58) Field of Search ................................ 438/595, 596, 438/303, 304, 305, 306, 307

(56) References Cited

U.S. PATENT DOCUMENTS

| | | |
|---|---|---|
| 5,153,145 A | 10/1992 | Lee et al. |
| 5,290,720 A | 3/1994 | Chen |
| 5,472,896 A | 12/1995 | Chen et al. |
| 5,714,413 A | 2/1998 | Brigham et al. ............ 438/301 |
| 5,770,508 A | 6/1998 | Yeh et al. ................... 438/305 |
| 6,096,657 A * | 8/2000 | Beckx et al. ............... 438/714 |

FOREIGN PATENT DOCUMENTS

FR 2760130 A1 * 8/1998

\* cited by examiner

Primary Examiner—Tuan H. Nguyen
(74) Attorney, Agent, or Firm—George O. Saile; Rosemary L. S. Pike

(57) ABSTRACT

A method for forming an L-shaped spacer using disposable polysilicon top spacers. A semiconductor structure is provided having a gate structure thereon. A liner oxide layer is formed on the gate structure. A dielectric spacer layer is formed on the liner oxide layer. A disposable polysilicon top spacer layer is formed on the dielectric spacer layer. The disposable polysilicon top spacer layer is anisotropically etched to form disposable polysilicon top spacers. The dielectric spacer layer is etched to form L-shaped dielectric spacers, using the disposable polysilicon top spacers as an etch mask. The disposable polysilicon top spacers are removed leaving an L-shaped dielectric spacer. In one embodiment, lightly doped source and drain regions are formed prior to forming the liner oxide layer and the L-shaped spacers.

6 Claims, 3 Drawing Sheets

METHOD FOR FORMING AN L-SHAPED SPACER USING A DISPOSABLE POLYSILICON SPACER

BACKGROUND OF INVENTION

1) Field of the invention

This invention relates generally to fabrication of a semiconductor device and more particularly to a method for forming an L-shaped spacer using a disposable polysilicon top spacer.

2) Description of the Prior Art

As the physical geometry of semiconductors continues to shrink, the space between gate electrodes shrinks as well. The reduced space between gate electrodes can cause poor gap fill by the subsequent dielectric layer (eg inter-layer dielectric) resulting in degraded performance.

One approach which has been used to solve this problem is the use of spacers on the gate electrode sidewalls which are smaller at the top than they are at the bottom, such as L-shaped spacers. In a typical L-shaped spacer two dielectric layers (the first composed of silicon nitride and the second composed of silicon oxide) are formed over and around a gate electrode, then anisotropically etched. However, the top oxide portion of the spacer can not be easily removed without damaging oxide isolation structures. Conversly, if the top oxide portion of the spacer remains, it can be effected by post-etch wet chemical process causing inconsistent spacer shape and size across the IC and between IC's. Also, the gap filling ability of the subsequent dielectric layer is not optimized, because the aspect ratio remains high due to the presence of the oxide portion of the spacers.

Another problem with conventional L-shaped spacers is that dry etching nitride spacers can result in variations in spacer width between isolated areas and areas nested between adjacent gates. These variations in spacer width will cause unsymmetrical transistors, resulting in performance problems.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,770,508 (Yeh et al.) shows a process for forming an L-shaped spacer using an oxide layer and an overlying nitride layer, anisotropically etching to form spacers, then removing the nitride layer, leaving an L-shaped oxide spacer. Ions are implanted through the L-shaped spacer to form shallow source and drain extensions under the L-shaped spacer and moderate-depth source and drain regions beyond the L-shaped spacer.

U.S. Pat. No. 5,290,720 (Chen) shows an L-shaped spacer composed of polysilicon and formed using a disposable dielectric spacers.

U.S. Pat. No. 5,472,896 (Chen et al.) shows an L-shaped spacer composed of oxide.

U.S. Pat. No. 5,153,145 (Lee et al.) shows nested L-shaped spacers composed of oxide and nitride with a convex spacer thereover.

U.S. Pat. No. 5,714,413 (Brigham et al.) shows an L-shsped shaped spacer with a silicon nitride layer.

SUMMARY OF THE INVENTION

It is an object of the present invention to provide a method for forming an L-shaped spacer using a disposable polysilicon top spacer.

It is another object of the present invention to provide a method for forming an L-shaped spacer which can be symmetrically etched in areas having different spacing between structures.

It is another object of the present invention to provide a method for forming an L-shaped spacer that provides for better gap filling properties of the subsequently formed, overlying dielectric layer.

It is yet another object of the present invention to provide a method for forming an L-shaped dielectric spacer which is compatible with a smaller gap between adjacent gates.

To accomplish the above objectives, the present invention provides a method for forming an L-shaped spacer using a disposable polysilicon top spacer. A semiconductor structure is provided having a gate structure thereon. A liner oxide layer is formed on the gate structure. A dielectric spacer layer, preferably comprising silicon nitride, is formed on the liner oxide layer. A disposable polysilicon spacer layer is formed on the dielectric spacer layer. The disposable polysilicon spacer layer is anisotropically etched to form disposable polysilicon top spacers. The dielectric spacer layer is then etched to form L-shaped dielectric spacers, using the disposable polysilicon top spacers as an etch mask. The disposable polysilicon top spacers are removed using a selective etching process, leaving symmetrical, L-shaped dielectric spacers which are sufficiently open to provide for good gap filling properties of the overlying dielectric layer.

The present invention provides considerable improvement over the prior art. The spacer which results from the process of the present invention is less susceptible to postetch wet chemical processing than an oxide layer, resulting in a more uniform spacers, both across the IC and between IC's. Because the disposable polysilicontop spacers can be completely removed using a selective etch, the resulting L-shaped dielectric spacers are open and provide better gap filling properties of the subsequent dielectric layer (eg interlevel dielectric).

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming L-shaped dielectric spacers using disposable polysilicon top spacers.

PROBLEM IDENTIFIED BY THE INVENTORS

Figure 1:
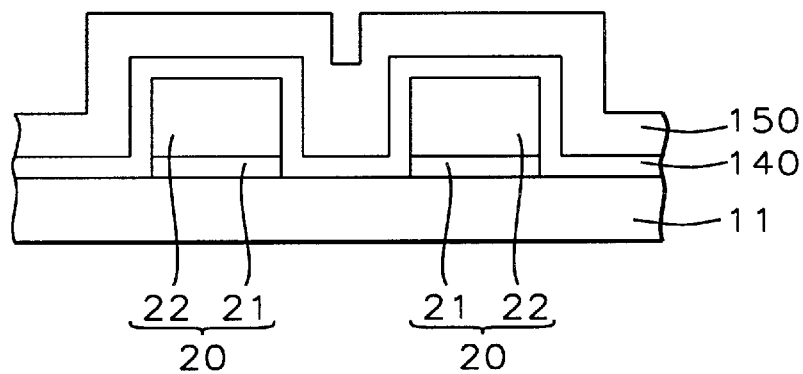
FIGS. 1 through 3 illustrate sequential sectional views of a process for forming L-shaped spacers according to a process known by the inventors to have a problems.

A process for forming an L-shaped spacer known by the inventors to have a problem is described with reference to FIGS. 1 through 3. In the problem process, a semiconductor structure (11) is provided having a gate structure (20) thereon, as shown in FIG. 1. The gate typically comprises a gate oxide layer (21) with an overlying gate electrode (22). A nitride layer (140) is formed over the gate structure (20) and an oxide layer (150) is formed on the nitride layer (140).

Figure 2:
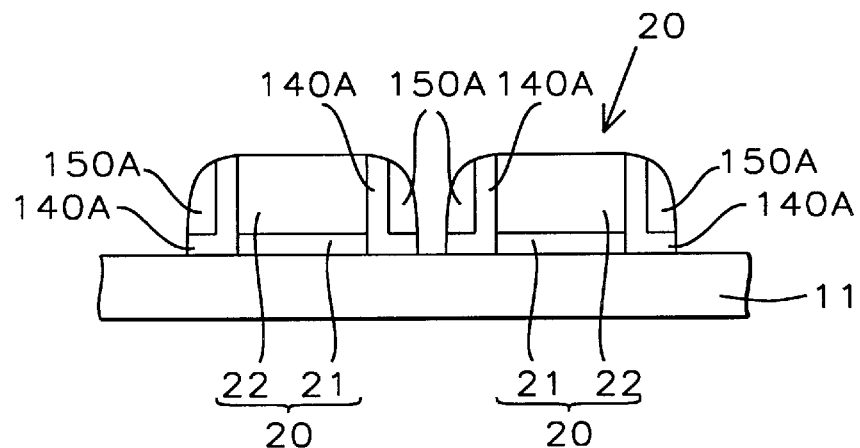

As shown in FIG. 2, an L-shaped spacer (160) is formed by anisotropically etching the oxide layer (150) and the nitride layer (140). The remaining nitride layer (140A) of the L-shaped spacer (160) is shaped like the letter "L". One problem with this process identified by the inventors is that the remaining oxide layer (150) of the L-shaped spacer can not be easily removed using a selective oxide etch, because it would damage isolation structures which are typically used to isolate various active areas on an IC. Leaving the oxide layer (150) intact aggrevates the gap-fill problem for closely spaced gates.

Another problem with this process, as shown in FIG. 2, is that the etch rate of the oxide layer will be slower between closely spaced gates (nested areas) than for spacers without a closely spaced adjacent gate (isolated areas). This difference in etch rate will cause larger spacers in nested areas than in isolated areas resulting in unsymmetrical transistors.

Figure 3:
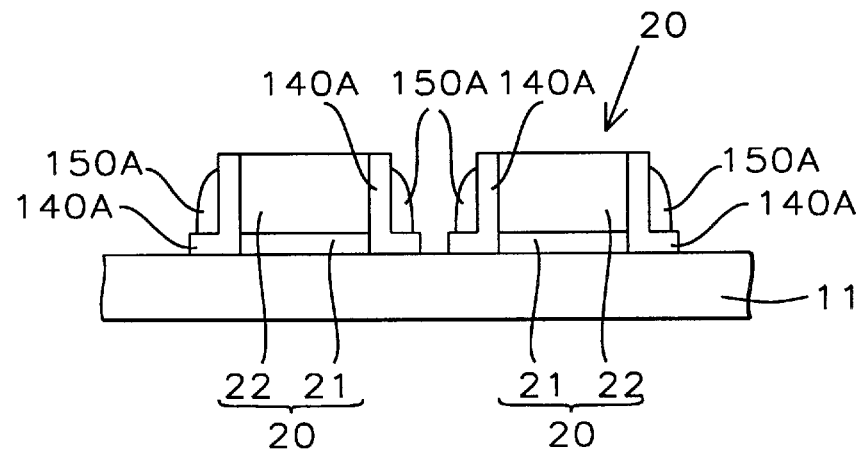

Also, as shown in FIG. 3, the shape and size of the remaining oxide layer (150A) of the L-shaped spacer (160) can be altered by post-etch wet chemical processes which are typically used in IC fabrication. Wet chemical processes, particularly ET processes will reduce the size of the oxide layer (150). The reduction is size is dependant upon the length of the exposure which can vary across the IC between IC's. Variations in the shape and size of the L-shaped spacers results in inconsistent performance parameters for the transistor formed from the gates with the L-shaped spacers.

PREFERRED EMBODIMENT OF THE PRESENT INVENTION

A preferred embodiment of the present invention is described with reference to FIGS. 4 through 7. The preferred embodiment provides a method for forming an L-shaped spacer using a disposable polysilicon top spacer. The present invention provides a consistently controllable opening which is adequate for good gap-filling characteristics. Also, the present invention provides uniform L-shaped spacers, resulting in symmetrical transistors.

Figure 4:
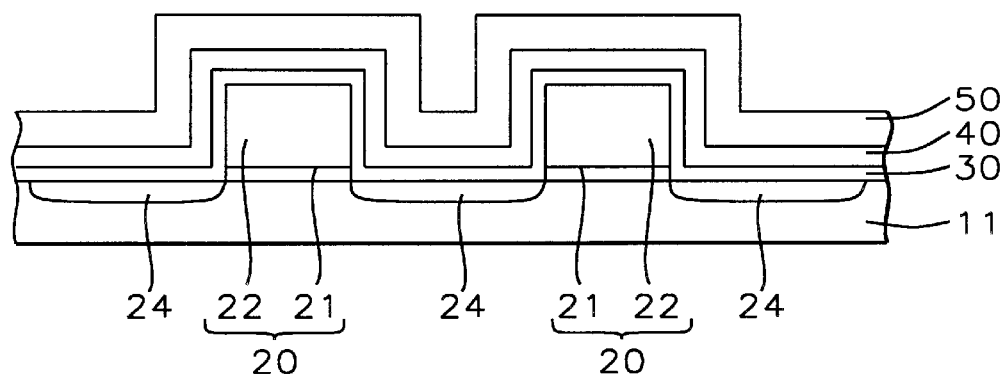
FIGS. 4 through 7 illustrate a preferred embodiment of a method for forming L-shaped spacers using disposable polysilicon top spacers according to the present invention.

Referring to FIG. 4, the preferred embodiment of the present invention begins by providing a semiconductor structure (11). Semiconductor substrate (11) is understood to possibly include a substrate comprising a wafer of semiconductor material such as silicon or germanium or a like substrate structure such as silicon-on-insulator (SOI) as is known in the art. Semiconductor structure (11) should be understood to possibly further include one or more conductive and/or insulating layers and passive and/or active devices formed on or over said substrate. The semiconductor structure (11) has a gate structure (20) thereon. The gate structure (20) typically comprises a gate dielectric layer (21) and a gate electrode (22) as is known in the art. The gate electrode (22) typically comprises doped polysilicon.

In the preferred embodiment of the present invention, lightly doped source and drain regions (LDDs) (24) are formed by implanting impurity ions into the surface of the semiconductor structure (11) prior to forming a liner oxide layer (30) and L-shaped spacers (40A). The implant can be performed using the gate structure (20) as an implant mask as is known in the art.

Still referring to FIG. 4, a liner oxide layer (30) is formed on the gate structure (20). The liner oxide layer (30) is preferably composed of silicon dioxide thermally grown to a thickness of between about 10 Angstroms and 300 Angstroms. The liner oxide layer (30) is important to prevent outdiffusion of dopant ions from the gate electrode and also to provide an etch stop for a subsequent silicon nitride etch.

Still referring to FIG. 4, a dielectric spacer layer (40) is formed on the liner oxide layer (30). The dielectric spacer layer (40) preferably comprises silicon nitride. The dielectric spacer layer (40) can be formed using a chemical vapor deposition (CVD) process, a plasma enhanced chemical vapor deposition (PECVD) process, or a rapid thermal chemical vapor deposition (RTCVD) process and preferably has a thickness of between about 50 Angstroms and 700 Angstroms.

Referring again to FIG. 4, a disposable polysilicon top spacer layer (50) is formed on the dielectric spacer layer (40). The disposable polysilicon top spacer layer (50) is composed of polysilicon having a thickness of between about 50 Angstroms and 800 Angstroms, and can be formed using a chemical vapor deposition process, a rapid thermal chemical vapor deposition process, or most preferably a hot wall chemical vapor deposition process.

Figure 5:
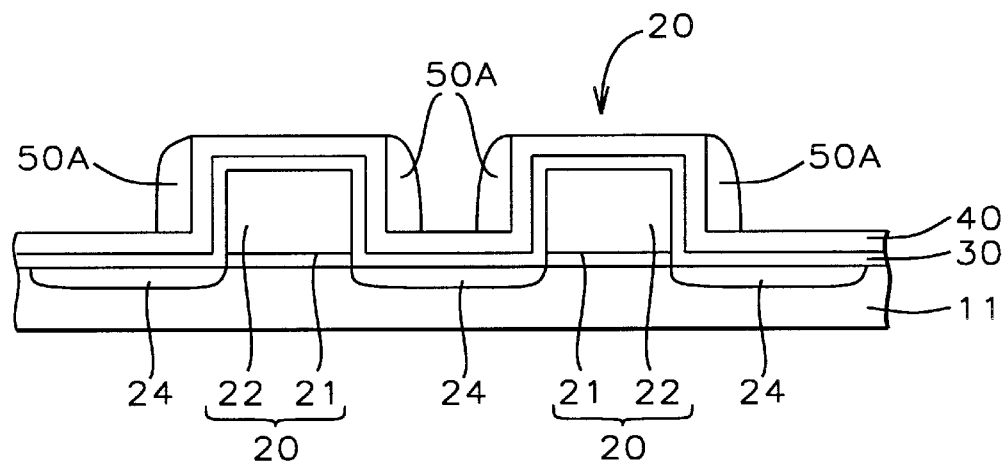

Referring to FIG. 5, the disposable polysilicon top spacer layer (50) is anisotropically etched to form disposable polysilicon top spacers (50A). The polysilicon top spacers (50A) can be formed using an anisotropic plasma etch selective to silicon nitride, stopping on the spacer dielectric layer (40). The inventors have determined that a plasma etch using a LAM TCP etching chamber and a $CF_4$, $Cl_2$, Hbr, $O_2$, He chemistry can be used to provide uniform disposable polysilicon top spacers (50), wherein a plasma can be formed using the top electrode and directionality can be controlled by the bottom electrode. The top electrode preferably has an energy of between about 75 watts and 450 watts and the bottom electrode preferably has a power of between about 50 watts and 300 watts.

Figure 6:
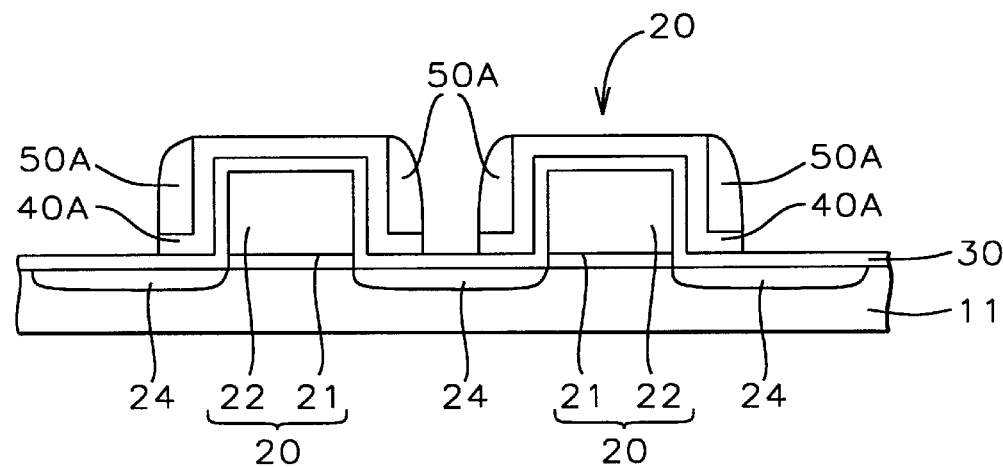

Referring to FIG. 6, the dielectric spacer layer (40) is etched to form L-shaped spacers (40A), using the disposable polysilicon top spacers (50A) as an etch mask. The etch used to form the L-shaped spacers (40A) is preferably formed in-situ in the LAM TCP chamber using a chemistry selective to oxide, such as $SF_{6/HBr/O2}$, $CH_2F_2/O_2$, $CH_3F/O_2$, $Cl_2$/HBr/$O_2$, or a combination thereof to stop on the liner oxide layer (30).

Figure 7:
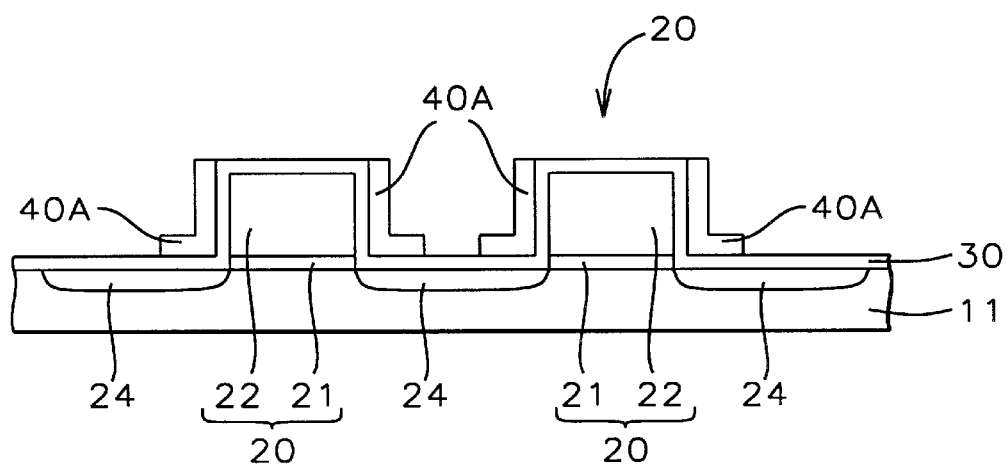

Referring to FIG. 7, the disposable polysilicon top spacers (50A) are removed leaving an L-shaped dielectric spacer (40A). The disposable polysilicon top spacers (50A) can be removed using a polysilicon plasma etch selective to both oxide and nitride. Preferably, an in-situ plasma etch using a LAM TCP etching chamber and a chemistry consisting of $Cl_2$, $HBr_{,O2}$, He or a combination thereof can be used to remove the disposable polysilicon top spacers (50), wherein a plasma can be formed using the top electrode and directionality can be controlled by the bottom electrode. The top electrode preferably has an energy of between about 50 watts and 450 watts and the bottom electrode preferably has a power of between about 50 watts and 300 watts.

Alternatively, the disposable polysilicon top spacers (50A) can be removed using a wet chemical etch having a selectivity to oxide and nitride such as hydroxyl ion containing chemicals (e.g. organic aqueous solution of choline hydroxide or inorganic aqueous solution of potassium hydroxide with w small amount of iodine).

The key advantages of the present invention are that L-shaped spacers formed using the present invention are more uniform in size regardless of whether they are in a nested area or an open area and they are less susceptible to changes in size and shape due to post-etching wet chemical processing, compared to prior art L-shaped spacers. Also, since the disposable polysilicon top spacers are completely removed, the L-shaped dielectric spacer is more open providing for better gap filling of the subsequent dielectric layer.

While the invention has been particularly shown and described with reference to the preferred embodiments thereof, it will be understood by those skilled in the art that various changes in form and details may be made without departing from the spirit and scope of the invention.

What is claimed is:

1. An in-situ method for forming an L-shaped spacer using disposable polysilicon top spacers, comprising the steps of:
   a. providing a semiconductor structure having a gate structure thereon;
   b. implanting impurity ions to form lightly doped source and drain regions;
   c. forming a liner oxide layer on said gate structures;
   d. forming a dielectric spacer layer on said liner oxide layer; said dielectric spacer layer comprising silicon nitride;
   e. forming a disposable polysilicon top spacer layer on said dielectric spacer layer;
   f. anisotropically etching said disposable polysilicon top spacer layer to form disposable polysilicon top spacers;
   g. in-situ, anisotropically etching said dielectric spacer layer to form L-shaped dielectric spacers, using said disposable polysilicon top spacers as an etch mask; and
   h. in-situ, removing said disposable polysilicon top spacers.

2. The method of claim 1 wherein said dielectric spacer layer comprises silicon nitride having a thickness of between about 50 Angstroms and 700 Angstroms.

3. The method of claim 1 wherein said disposable polysilicon top spacer layer comprises chemical vapor deposition polysilicon having a thickness of between about 50 Angstroms and 800 Angstroms.

4. The method of claim 1 wherein said disposable polysilicon top spacer is formed by anisotropically plasma etching said disposable polysilicon top spacer layer using a chemistry consisting of $CF_4$, $Cl_2$, Hbr, $O_2$, He or any combination thereof; with a top electrode power of between about 50 watts and 450 watts and a bottom electrode power of between about 50 watts and 300 watts.

5. The method of claim 1 wherein said dielectric spacer layer is anisotropically plasma etched in-situ to form L-shaped dielectric spacers using said disposable polysilicon top spacers as an etch mask; said dielectric spacer layer being etched with a, chemistry consisting of $SF_6/HBr/O_2$, $CH_2F_2/O_2$, $CH_3F/O_2$, $Cl_2/HBr/O_2$, or a combination thereof, a top electrode power of between about 50 watts and 300 watts, and a bottom electrode power of between about 50 watts and 300 watts.

6. The method of claim 1 wherein said disposable polysilicon top spacers are removed using an in-situ plasma etch.

* * * * *